US008872667B2

(12) United States Patent
Bhageria et al.

(10) Patent No.: US 8,872,667 B2
(45) Date of Patent: Oct. 28, 2014

(54) FAULT ISOLATION AND SERVICE RESTORATION IN AN ELECTRIC GRID

(75) Inventors: Gopal K. Bhageria, Overland Park, KS (US); Don T. Mak, Reston, VA (US); Kevin M. Monagle, Wellesley, MA (US); Sri Ramanathan, Lutz, FL (US); Jean-Gael F. Reboul, Kenmore, WA (US); Matthew A. Terry, Dunwoody, GA (US); Matthew B. Trevathan, Kennesaw, GA (US)

(73) Assignee: International Business Machines Corporation, Armonk, NY (US)

( * ) Notice: Subject to any disclaimer, the term of this patent is extended or adjusted under 35 U.S.C. 154(b) by 369 days.

(21) Appl. No.: 13/231,780

(22) Filed: Sep. 13, 2011

(65) Prior Publication Data
US 2013/0063273 A1 Mar. 14, 2013

(51) Int. Cl.
G08B 21/00 (2006.01)
G05D 3/12 (2006.01)
G01R 31/08 (2006.01)

(52) U.S. Cl.
CPC .............. *G08B 21/00* (2013.01); *G01R 31/086* (2013.01)
USPC .............................. 340/635; 700/286; 702/58

(58) Field of Classification Search
CPC ..... G06Q 50/06; G08B 21/00; H02J 13/0079; Y04S 10/522
See application file for complete search history.

(56) References Cited

U.S. PATENT DOCUMENTS

| | | | |
|---|---|---|---|
| 6,963,793 B2 | 11/2005 | Yamada et al. | |
| 7,558,703 B2 | 7/2009 | Stoupis et al. | |
| 7,680,548 B2 | 3/2010 | Khorramshahi | |
| 7,710,950 B2 | 5/2010 | Buckley et al. | |
| 2004/0233598 A1 | 11/2004 | Yamada et al. | |
| 2006/0031293 A1 | 2/2006 | Thommes et al. | |
| 2006/0253567 A1 | 11/2006 | Selin et al. | |
| 2007/0243870 A1 | 10/2007 | Bantukul | |
| 2008/0077336 A1 | 3/2008 | Fernandes | |
| 2008/0103732 A1 | 5/2008 | Stoupis et al. | |
| 2008/0177678 A1 | 7/2008 | Di Martini et al. | |
| 2009/0088907 A1 | 4/2009 | Lewis et al. | |

(Continued)

FOREIGN PATENT DOCUMENTS

| | | |
|---|---|---|
| CN | 1536737 | 10/2004 |
| CN | 101425672 | 5/2009 |
| EP | 2156978 A2 | 2/2010 |
| WO | 2008054664 | 5/2008 |

OTHER PUBLICATIONS

International Search Report and Written Opinion dated Oct. 4, 2012 in PCT Application No. PCT/CN2012/077225, 10 pages.

(Continued)

Primary Examiner — Steven Lim
Assistant Examiner — Omeed Alizada
(74) Attorney, Agent, or Firm — Lisa Ulrich; Roberts Mlotkowski Safran & Cole, P.C.

(57) ABSTRACT

Fault isolation and service restoration in an electrical grid are provided. An approach for receiving a notification message including a state of an electrical component on an electrical grid, and determining, by a computing system, a command message including at least one action to take in response to the state of the electrical component, is described. The approach further includes sending the command message to at least one of the electrical component and other electrical components on the electrical grid.

14 Claims, 12 Drawing Sheets

(56) References Cited

U.S. PATENT DOCUMENTS

| | | | |
|---|---|---|---|
| 2009/0112375 A1 | 4/2009 | Popescu | |
| 2009/0129376 A1 | 5/2009 | Johnson | |
| 2009/0240449 A1 | 9/2009 | Gibala et al. | |
| 2010/0077069 A1 | 3/2010 | Kim | |
| 2010/0100250 A1 | 4/2010 | Budhraja et al. | |
| 2010/0131329 A1 | 5/2010 | An et al. | |
| 2010/0134117 A1 | 6/2010 | Dzafic | |
| 2010/0150122 A1 | 6/2010 | Berger et al. | |
| 2010/0152910 A1 | 6/2010 | Taft | |
| 2010/0157980 A1 | 6/2010 | Ellsworth et al. | |
| 2010/0161815 A1 | 6/2010 | Pettissalo | |
| 2010/0217449 A1 | 8/2010 | Musti et al. | |
| 2011/0066297 A1 | 3/2011 | Saberi et al. | |
| 2011/0071693 A1 | 3/2011 | Sun et al. | |
| 2012/0031581 A1* | 2/2012 | Chillar et al. | 165/11.1 |

OTHER PUBLICATIONS

Joe Diadamo, "SIP: The Clear Choice for Smart Grid Communications", Jun. 23, 2009, 3 pages, SmartGridNews.com, http://www.smartgridnews.com/artman/publish/commentary/SIP_The_Clear_Choice_for_Smart_Grid_Communications-604.html.

Siemens Enterprise Communications, "SIP-Open Comunications for Smart Grid Devices", Jun. 2009; 24 Pages.

Leeds, "The Smart Grid in 2010: Market Segments, Applications and Industry Players," GTM Research, Jul. 2009; 145 Pages.

Office Action dated Jan. 17, 2014 in U.S. Appl. No. 13/231,787; 25 pages.

Final Office Action dated Aug. 12, 2014 in related U.S. Appl. No. 13/231,787; 55 pages.

\* cited by examiner

FAULT ISOLATION AND SERVICE RESTORATION IN AN ELECTRIC GRID

TECHNICAL FIELD

The present invention generally relates to fault isolation in an electric grid, and more particularly, to a system and a method for decentralized and centralized fault isolation and service restoration in an electrical grid.

BACKGROUND

An electrical grid is an interconnected network for delivering electricity from suppliers to consumers. More specifically, the electrical grid is a vast, interconnected network of transmission lines, starting from a supplier of electricity to a consumer of the electricity. The consumer may be, for example, a personal consumer or an industrial consumer.

It has become increasingly important to manage the electrical grid, in order to more efficiently distribute electricity in an environmentally friendly manner. For example, the electrical grid has started to be connected to low or zero emission sources such as, e.g., windmills, hydropower plants and solar panels. In another example, electricity suppliers are providing discounted fees for off-peak electricity consumption, e.g., providing cost incentives to consumers for those using their appliances during off-peak times.

Also, it has become more vital to manage the electrical grid to distribute electricity in a more efficient manner. Electricity suppliers must often monitor their electrical grids for downed power lines to prevent such problems from disrupting electricity supply throughout the grids. For example, natural disasters or incidents, such as a tree falling on a power distribution line, may generate transient or sustained electrical faults in the electrical grid, thus causing temporary local or wide-area power outages. In order to provide reliable power, electricity suppliers must be able to detect such electrical faults.

However, electricity suppliers are often not provided with enough information regarding the electrical grid to effectively monitor the grid during power outages, peak demand times, etc. For example, natural disasters or incidents that generate electrical faults may prevent suppliers from deploying field crews to analyze electrical devices on the electrical grid. In addition, even if the electricity suppliers are provided information regarding electrical devices, the suppliers may not be able to react and control the electrical faults in time to prevent further power outages.

SUMMARY

In a first aspect of the invention, a method includes receiving a notification message including a state of an electrical component on an electrical grid, and determining, by a computing system, a command message including at least one action to take in response to the state of the electrical component. The method also includes sending the command message to at least one of the electrical component and other electrical components on the electrical grid.

In another aspect of the invention, a system is implemented in hardware which includes a computer infrastructure operable to receive a notification message of an electrical device on an electrical grid, the notification message including a status of the electrical device. The computer infrastructure is further operable to predict an electrical fault of the electrical device based on a set of rules related to the electrical device and the notification message. The computer infrastructure is also operable to send a command action to at least one of the electrical device and other electrical components in response to the predicted electrical fault, the command action including corrective action to reroute electricity in an electrical path, by passing the predicted electrical fault.

In an additional aspect of the invention, a computer program product includes a computer usable storage medium having readable program code embodied in the storage medium. The computer program product includes at least one component operable to receive a notification message including a state of an electrical component on an electrical grid. The at least one component is further operable to determine a command message including at least one action to take in response to the state of the electrical component, and send the command message to at least one of the electrical component and other electrical components on the electrical grid.

In a further aspect of the invention, a method for decentralized and centralized fault isolation and service restoration in an electrical grid, including providing a computer infrastructure, being operable to send a register message to register in a network, and record an electrical event at a location on the electrical grid. The computer infrastructure is further operable to send a notification message including presence information of the electrical event, through the network to a presence server, and receive a command message including at least one action to take in response to the electrical event. The computer infrastructure is further operable to perform the at least one action to take.

In another aspect of the invention, a computer system for decentralized and centralized fault isolation and service restoration in an electrical grid includes a CPU, a computer readable memory and a computer readable storage media. First program instructions receive a notification message including a state of an electrical component on the electrical grid. Second program instructions determine a command message including at least one action to take in response to the state of the electrical component. Third program instructions send the command message to at least one of the electrical component and other electrical components on the electrical grid to reconfigure the electrical grid to bypass the fault isolation. The electrical component and the other electrical components are reconfigured based on the command message by performing the at least one action to take in response to the state of the electrical component. The first, second, and third program instructions are stored on the computer readable storage media for execution by the CPU via the computer readable memory.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
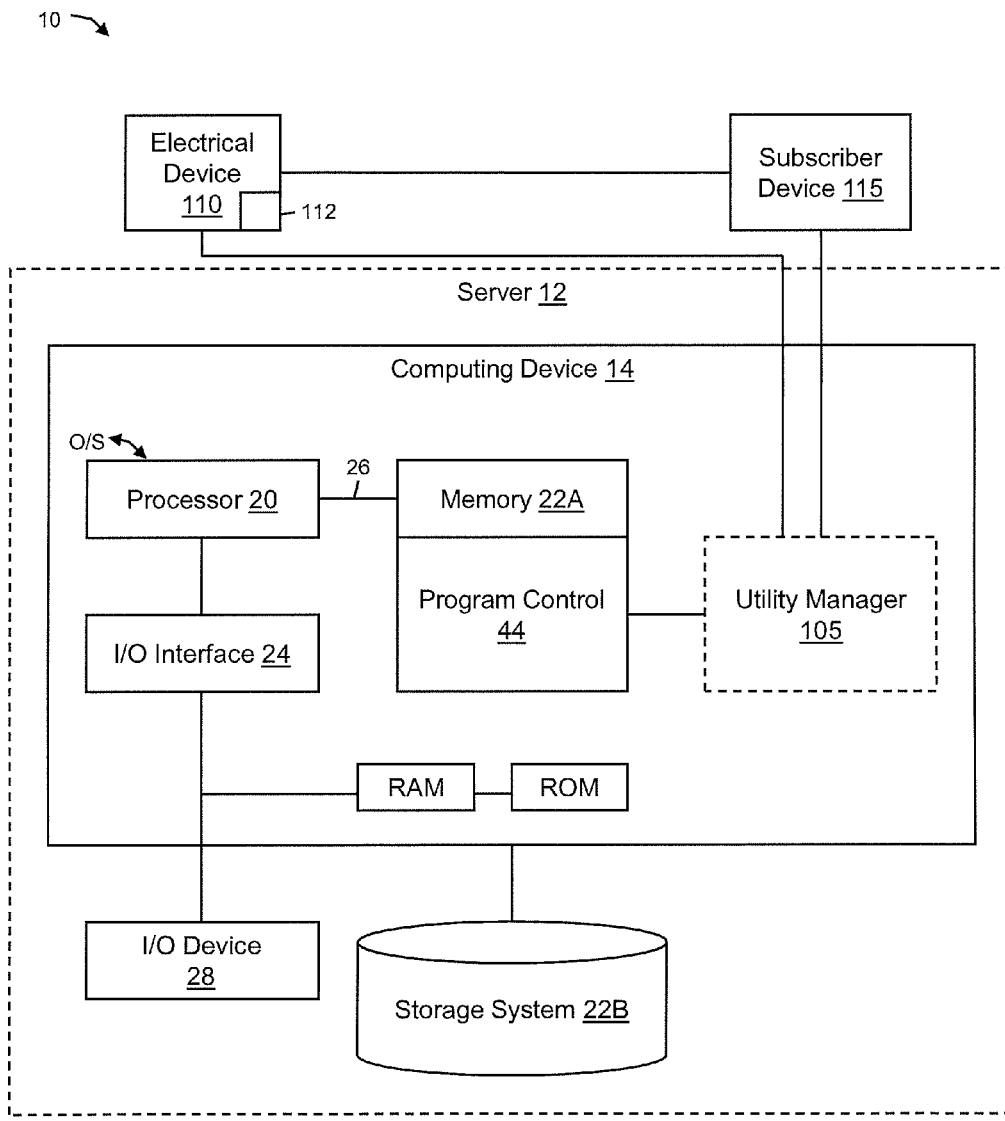
FIG. 1 shows an illustrative environment of a server and/or a computing device for implementing steps in accordance with aspects of the invention.

The present invention generally relates to fault isolation in an electrical grid, and more particularly, to a system and a method for decentralized and centralized fault isolation and service restoration in an electrical grid. In embodiments, the present invention provides communication and monitoring capability of the electrical grid to more effectively manage the electrical grid as it becomes ever more complex to manage. For example, to manage the many different demands on the electrical grid and to ensure that the electrical grid is working most efficiently, the present invention provides an Internet Protocol (IP) backplane with the traditional electrical grid so as to allow efficient communication between a utility (e.g., service provider, electricity supplier, etc.) and electrical devices on the electrical grid.

More specifically, the present invention provides Session Initiation Protocol (SIP) as a low-latency, scalable communication protocol used by the electrical grid, particularly, between the electrical device and the utility or electricity supplier. Further, the present invention provides a presence server in a utility domain or in a telecommunications domain. The presence server allows authorized entities, such as the utility (e.g., service provider, electricity supplier, etc.), a network service provider, and/or an individual user, to subscribe to status information of the electrical device. This allows such entities to receive the recorded status information of the electrical device which, in turn, allows the entities to interact with the electrical grid. This can provide location information, as well as other pertinent information (e.g., electrical failures, status information), to those individuals that are servicing and/or monitoring the electrical grid. This, in turn, allows the supplier of electricity (e.g., the utility or other service provider) to manage and monitor the electrical grid and thereby more efficiently and effectively control and maintain the electrical devices on the electrical grid. For example, by receiving information directly from the electrical grid, it is now possible to detect electrical faults or abnormal conditions directly from the electrical devices. For example, the supplier of electricity (e.g., service provider) can now monitor the electrical grid using an IP backplane in order to effectively isolate the electrical faults or abnormal conditions of devices in the electrical grid.

In more specific embodiments, the IP backplane can notify a utility manager at the control center of an electricity supplier that an issue exists on the electrical grid, for example, at one of the electrical devices on the electrical grid. This information can be granular to the extent and location of any issue. In turn, the utility manager can send to the problematic electrical device (and/or nearby electrical devices) a SIP-based command message that instructs the electrical device to execute a reconfiguration of the electrical device. This SIP-based command message may allow the electrical device to be isolated on the electrical grid. Once the issue is isolated, the utility manager may analyze the electrical devices on the electrical grid to determine a switching plan for the electrical devices that would restore power service to as many customers as possible. For example, the utility manager may send to the electrical device(s) additional SIP-based command messages that instruct the electrical device(s) to turn on or off, such that power is rerouted away from the problematic electrical device and is restored to customers who may have lost power.

Advantageously, the present invention provides utilities additional information (e.g., the voltage and/or the current) of electrical devices via remote, on-demand notifications from the electrical devices. In addition, the present invention provides more remote control of the electrical devices to the utilities to isolate electrical faults on the electrical grid and subsequently restore services. The present invention allows fault isolation and service restoration to be achieved in a centralized approach (e.g., at the utilities and their control centers) or in a decentralized approach (e.g., at locations within the electrical grid). The present invention also allows fault isolation to be achieved reactively (e.g., in response to a detected electrical fault) and/or proactively (e.g., before a predicted electrical fault occurs), further increasing the reliability of the electrical grid. The present invention allows the utility to obtain more accurate, real-time information of electrical patterns across the electrical grid. By utilizing telecommunications technology and the Mobile Web, the electrical grid is fully-integrated with and connected to the Internet and can be managed to a more granular level.

SYSTEM ENVIRONMENT

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1).

The computing device 14 includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be, for example, a handheld device, PDA, handset, keyboard, etc.

In general, the processor 20 executes computer program code (e.g., program control 44), which can be stored in the memory 22A and/or storage system 22B. Moreover, in accordance with aspects of the invention, the program control 44 controls a utility manager 105, e.g., the processes described herein. The utility manager 105 communicates with at least one electrical device 110 (on an electrical grid) and at least one subscriber device 115. The communication between the utility manager 105, the electrical device 110, and the subscriber device 115 can be through, for example, Session Initiation Protocol (SIP) messaging using, e.g., instant messaging or other communications utilizing SIP.

As should be understood by those of skill in the art, SIP is a signaling protocol widely used for controlling multimedia communication sessions, such as voice and video calls over Internet Protocol (IP). The SIP can be used for creating, modifying, and terminating two-party (unicast) or multiparty (multicast) sessions consisting of one or several media streams. In embodiments, the present invention implements SIP as video conferencing, streaming multimedia distribution, instant messaging, presence information and/or file transfer applications. In embodiments, SIP can be implemented as a text-based protocol, incorporating many elements of the Hypertext Transfer Protocol (HTTP) and the Simple Mail Transfer Protocol (SMTP). Also, as used in the present invention, SIP is an Application Layer protocol designed to be independent of the underlying transport layer, and as such, can run on Transmission Control Protocol (TCP), User Datagram Protocol (UDP), or Stream Control Transmission Protocol (SCTP).

The utility manager 105 can be implemented as one or more program code in the program control 44 stored in memory 22A as separate or combined modules. Additionally, the utility manager 105 may be implemented as separate dedicated processors or a single or several processors to provide the function of this tool. Moreover, it should be understood by those of ordinary skill in the art that the utility manager 105 is used as a general descriptive term for providing the features and/or functions of the present invention, and that the utility manager 105 may comprise many different components such as, for example, components and/or infrastructure described and shown with reference to FIGS. 2-3.

In embodiments, the electrical device 110 can be any device involved in the generation, transmission, and/or distribution of electricity on an electrical grid such as, for example, fuses, transformers, circuit breakers, capacitors, voltage regulators, compensators, relays, feeders, switches, protection devices, gateways (e.g., a router), solar panels, plug-in electric vehicles, and/or any other electrical grid infrastructure devices. The electrical device 110 may be located at, for example, an electrical substation, a power station, or anywhere in the transmission line, on the electrical grid. Further, the electrical device 110 may be located within various types of electrical grids, e.g., a low-voltage (up to 60 kilovolts (kV)) grid, a high-voltage (110 kV and up) grid, and/or an extra high-voltage (265 kV and up, AC and high-voltage DC (HVDC)) grid.

In embodiments, the electrical device 110 includes a monitoring device 112. The monitoring device 112 can be any type of electrical monitoring device such as, for example, a voltage meter, a current meter, etc., with the capability of transmitting monitored status information to the utility manager 105, e.g., via SIP. In embodiments, the monitoring device 112 transmits the monitored status information to the utility manager 105 and/or the subscriber device 115. In embodiments, the monitoring device 112 may also transmit presence information to the utility manager 105 and/or the subscriber device 115. In embodiments, the presence information (presence state) is provided by a network connection to a presence service, which can be, for example, depicted as the utility manager 105 (or other third party device). In embodiments, the presence information may include the status information of the electrical device 110, the type of the electrical device 110, and its specifications. In further embodiments, the location of the particular electrical device 110 may also be provided, for example, using presence information or through a look up table in the computing device 14. As to the latter scenario, once presence information is received at the computing device 14, this information may be matched in a look-up table with pertinent location information for the electrical device 110.

In embodiments, the subscriber device 115 (e.g., a smartphone, a personal computer (PC), a laptop, etc.) is in communication with the utility manager 105 and/or the electrical device 110. For example, in embodiments, the subscriber device 115 can be used by a field crew and/or a dispatcher of a service provider or an electricity supplier at a utility control center.

In implementation, the subscriber device 115 can send and receive messages to and from the utility manager 105 in order to manage the electrical device 110. For example, through SIP messaging, the subscriber device 115 may subscribe to and receive status information from the electrical device 110, to interact with and detect an electrical fault of the electrical device 110. This status information may be received by the subscriber device 115 and/or the utility manager 105. The subscriber device 115 may also send a request to the utility manager 105 for the status information of the electrical device 110.

In embodiments, through the use of rules stored in the storage system 22B, for example, the utility manager 105 can send a command message to the electrical device 110 to reconfigure the electrical device 110. The rules indicate what constitute critical events (e.g., electrical faults) at the electrical device 110 and how to manage the electrical device 110 upon the occurrence of the critical events (e.g., isolate the electrical faults via a command message to the electrical device 110). Accordingly, management of the electrical device 110 may be accomplished remotely via the utility manager 105.

In operation, for example, the utility manager 105 can be located at a distribution feeder head or a transmission substation, on an electrical grid. The utility manager 105 may receive from the electrical device 110 a SIP-based message which indicates that an electrical fault or abnormal condition has been detected at the electrical device 110. In response to this message, the utility manager 105 may determine at least one rule indicating at least one action to take and perform the action to take based on the message. For example, the determined rule may include a defined centralized remedial action scheme that instructs the utility manager 105 to isolate the electrical device 110 from the electrical grid (e.g., reroute power away from the electrical device 110) when an electrical fault is detected. Since the message from the electrical device 110 indicates an electrical fault at the electrical device 110, the utility manager 105 may send a command message to the electrical device 110 to isolate the electrical device 110 from the electrical grid.

Advantageously, the present invention provides electricity suppliers (e.g., the utility manager 105) with accurate and up-to-date information of electrical devices (e.g., the electrical device 110) on an electrical grid, to ensure its reliability. The present invention also provides electricity suppliers with real-time control of electrical devices on an electrical grid, to better react to and prevent power outages. Further, the present invention provides integration of an electrical grid and the Internet by using low latency communications, such as SIP and/or User Datagram Protocol (UDP) communications.

While executing the computer program code, the processor 20 can read and/or write data to/from memory 22A, storage system 22B, and/or I/O interface 24. The program code executes the processes of the invention, for example, functions of a presence server, e.g., managing the electrical device 110 of the electrical grid. The bus 26 provides a communications link between each of the components in the computing device 14.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2:
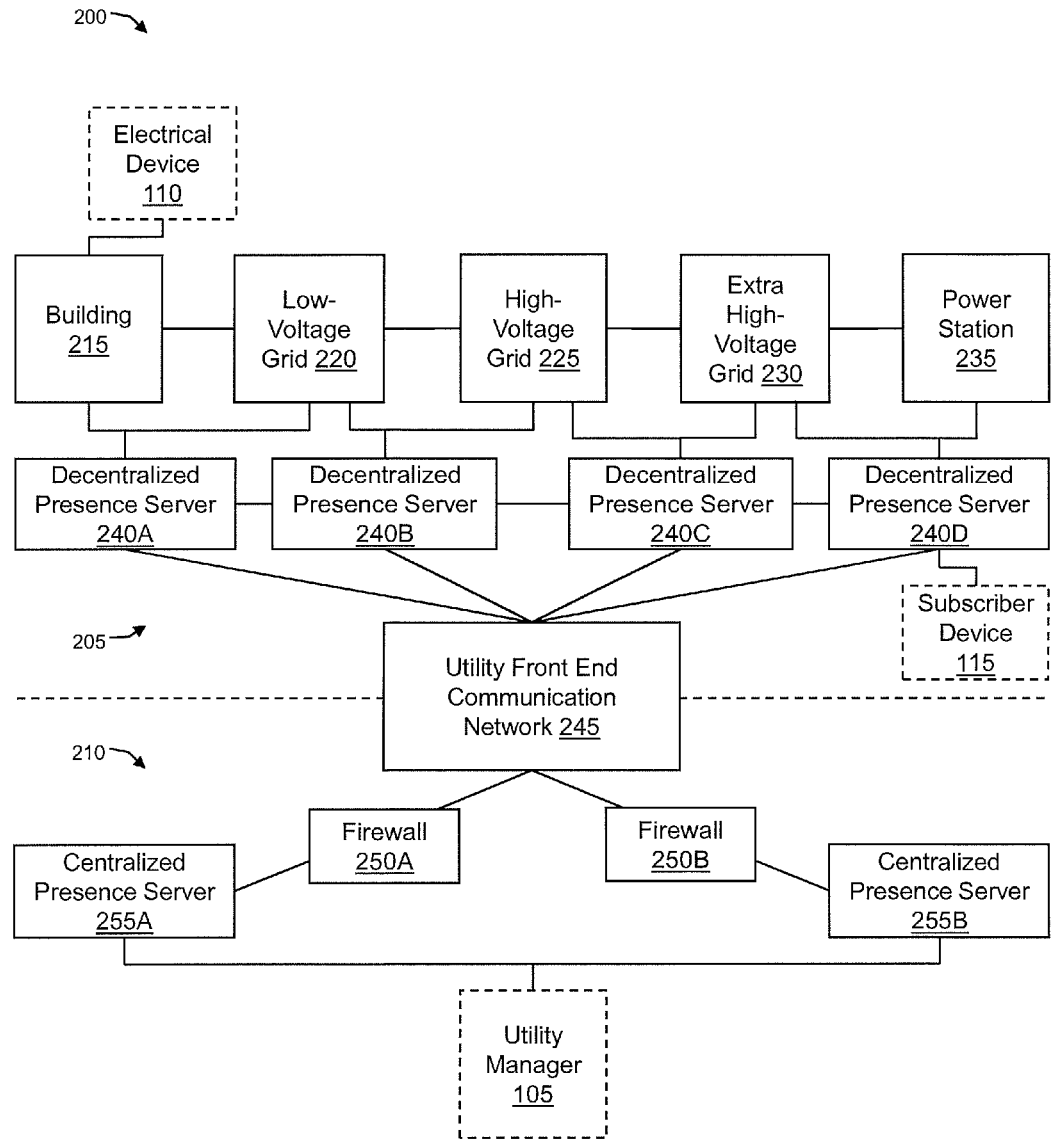
FIG. 2 shows an illustrative environment for implementing the steps in accordance with aspects of the invention.

FIG. 2 shows an illustrative environment 200 for implementing the steps in accordance with aspects of the invention. The environment 200 includes a utility front end 205 and a utility back end 210. In embodiments, the utility front end 205 can include the electrical device 110 and the subscriber device 115, and the utility back end 210 can include the utility manager 105. In embodiments, the utility manager 105, the electrical device 110, and the subscriber device 115 may include the utility manager 105, the electrical device 110, and the subscriber device 115, respectively, in FIG. 1. The electrical device 110 may include a device involved in the generation, transmission, and distribution of electricity, such as a fuse, a transformer, a circuit breaker, a capacitor, a voltage regulator, a reactor, a compensator, a relay, a feeder, a switch, a protection device, a gateway (e.g., a router), solar panels, plug-in electric vehicles, and/or any other electrical grid infrastructure device, for example. The electrical device 110 may be located at, for example, an electrical substation, a power station, and/or anywhere along a transmission line in an electrical grid. The electrical device 110 includes a lightweight SIP client and a radio antenna connected to the SIP client, allowing the electrical device 110 to communicate in SIP with other entities that can also communicate in SIP, such as the utility manager 105 and the subscriber device 115.

In embodiments, the utility front end 205 can further include various types of premises and grids within the overall electrical grid, e.g., a building 215, a low-voltage grid 220, a high-voltage grid 225, an extra high-voltage grid 230, and/or a power station 235. The building 215 (e.g., a hospital building and/or a complex of buildings), the grids 220, 225, and 230, and the power station 235 may be electrically connected to each other, and may generate, transmit, and distribute electricity between each other. Each of the building 215, the grids 220, 225, 230, and the power station 235 may include a SIP client or gateway within their location areas and a radio antenna connected to the SIP client or gateway, allowing the building 215, the grids 220, 225, 230, and the power station 235 to communicate in SIP with other SIP-enabled entities. The electrical device 110 may be within the location areas of the building 215, the grids 220, 225, 230, and/or the power station 235. It should be understood that the electrical device 110 may be within the building 215, and the utility manager 105 can provide control to manage the generation, transmission, and distribution of electricity in the building 215. Accordingly, the present invention is capable of being implemented in a micro level (e.g., within a building 215 or a complex of buildings) or a macro level (e.g., the electrical grid).

In accordance with further aspects of the invention, the utility front end 205 can include decentralized presence servers 240A, 240B, 240C, and 240D, which can be located in front end electrical premises of a utility or an electrical grid, e.g., the building 215, the grids 220, 225, and/or 230, and the power station 235. The decentralized presence servers 240A, 240B, 240C, 240D may be in communication with the building 215, the grids 220, 225, and/or 230, and the power station 235, for example, over SIP. The decentralized presence servers 240A, 240B, 240C, 240D may also be in communication with the subscriber device 115 (shown in connection to the decentralized presence server 240D), as well as a utility front end communication network 245.

In embodiments, the subscriber device 115 can be any device (e.g., a smartphone, a personal computer (PC), and/or a laptop) that interfaces with a subscriber (e.g., a field crew or a dispatcher of an electricity supplier). Like the electrical device 110, the subscriber device 115 also includes a lightweight SIP client and a radio antenna connected to the SIP client, which allow the subscriber device 115 to communicate in SIP with other SIP-based entities, such as the decentralized presence servers 240A, 240B, 240C, 240D. In embodiments, the subscriber device 115 may also include a web client that allows the subscriber device 115 to communicate in Hypertext Transfer Protocol (HTTP) with other entities that can also communicate in HTTP, e.g., the decentralized presence servers 240A, 240B, 240C, 240D. In embodiments, the subscriber device 115 may be connected to a presence server of the utility back end 210.

In accordance with further aspects of the invention, components of the utility front end 205 are in communication with components of the utility back end 210, via the utility front end communication network 245. In embodiments, the utility front end communication network 245 can be operated by, e.g., a utility or electricity supplier. The utility front end communication network 245 may also be any type of communication network, such as the Internet, a cellular network, etc.

In embodiments, the utility back end 210 can include firewalls 250A and 250B and centralized presence servers 255A and 255B. The firewalls 250A, 250B are in communication with the utility front end communication network 245, for example, over SIP and/or HTTP. Each of the firewalls 250A, 250B may include a computing device operable to permit or deny messages or transmissions from the utility front end 205 based on rules defined by the utility. For example, the firewalls 250A, 250B may be instructed to permit messages from only authorized presence servers, e.g., the decentralized presence servers 240A, 240B, 240C, 240D. The centralized presence servers 255A, 255B are in communication with the firewalls 250A, 250B, for example over SIP and/or HTTP. Through the firewalls 250A, 250B, the centralized presence servers 255A, 255B may receive the permitted messages of the decentralized presence servers 240A, 240B, 240C, 240D.

The centralized presence servers 255A, 255B may further be in communication with the utility manager 105 over, e.g., SIP and/or HTTP. The centralized presence servers 255A, 255B, and the utility manager 105 may be located in a back end, centralized premise of the utility or electricity supplier, e.g., a distribution, transmission, and generation control center, an Independent System Operator (ISO)/Regional Transmission Organization (RTO) grid control center, etc. In alternative embodiments, the utility manager 105 may be located in front end electrical premises of the utility or an electrical grid (e.g., the building 215, the grids 220, 225, and/or 230, and the power station 235), and may be in communication with the decentralized presence servers 240A, 240B, 240C, 240D.

In a reactive fault isolation operation, the decentralized presence servers 240A, 240B, 240C, 240D can receive a SIP-based notification message from an electrical device (e.g., the electrical device 110) located in, for example, the building 215, the grids 220, 225, and/or 230, and/or the power station 235. In embodiments, the notification message may include a fault detection notification message which indicates that an electrical fault or abnormal condition has been detected locally by the electrical device.

In a centralized approach, the decentralized presence servers 240A, 240B, 240C, 240D may forward the notification message through the utility front end communication network 245 and the firewalls 250A, 250B to the centralized presence servers 255A, 255B. At least one authorized watcher (e.g., the utility manager 105) in the utility back end 210 may be subscribed to the centralized presence servers 255A, 255B to watch for (e.g., receive) the notification message. In embodiments, the watcher may include a Supervisory Control and Data Acquisition (SCADA) system that, in response to the notification message, issues a SIP-based alarm message to be displayed to a system operator responsible for a particular area where the electrical fault is located. The SCADA system may also suggest a possible reconfiguration of the electrical device and nearby electrical devices to isolate (e.g., reroute power away from) the electrical fault, in which the system operator decides how to react to the electrical fault. The electrical device is considered at fault until a field crew or a system operator verifies conditions at the electrical device.

In embodiments, the watcher may include a generation, transmission, distribution or outage management system that, in response to the notification message, evaluates an extent of the electrical fault, a blackout area, and/or an instable section of an electrical grid, and identifies (automatically or manually) switching steps to isolate the electrical fault. Such steps may be executed by sending SIP-based command messages to electrical devices (e.g., switches) on the electrical grid, via the decentralized presence servers 240A, 240B, 240C, 240D. For example, the command message may include a fault isolation command message that instructs the electrical devices to execute requested configuration changes (e.g., switch on or off) aimed at isolating the electrical fault or abnormal condition. The command message may be sent to, for example, fuses or switches closest upstream or downstream from the faulty electrical device and that are remotely controllable by the utility back end watcher. The command message may also be sent to a circuit breaker near the faulty electrical device, and may instruct the circuit breaker to shut off. Advantageously, the present invention allows the utility to interact with electrical devices on an electrical grid in a centralized manner, and to isolate electrical faults, avoiding cascading events, e.g., further blackouts in areas of the electrical faults.

In a decentralized approach, at least one authorized watcher (e.g., the subscriber device 115) in the utility front end 205 can be subscribed to the decentralized presence servers 240A, 240B, 240C, 240D to watch for (e.g., receive) the notification message from the electrical device. In embodiments, the watcher in the utility front end 205 may initiate automatic switching steps to isolate the electrical fault. For example, these switching steps may be executed by sending SIP-based command messages to electrical devices (e.g., switches) on the electrical grid. The command message may include a fault isolation command message that instructs the electrical devices to execute requested configuration changes (e.g., switch on or off) aimed at isolating the electrical fault or abnormal condition. Advantageously, the decentralized approach of the present invention enables faster fault isolation, is closer to a self-healing system, and allows for fault isolation even when incidents (e.g., blackouts, communication network problems) cause the utility front end 205 to be cut off from the utility back end 210.

In a hybrid (centralized and decentralized) approach, the watcher in the utility front end 205 can forward the notification message along with any switching steps already performed to a watcher (e.g., the utility manager 105) in the utility back end 210. The utility back end watcher may take additional steps ensure the stability of the electrical grid, such as send additional command messages to other electrical devices to isolate electrical faults. Further, once the electrical faults are isolated, the utility back end watcher may initiate an automated or manual service restoration process to restore power to as many customers as possible.

More specifically, in a reactive service restoration operation, a centralized watcher in the utility back end 210 can identify customers on an electrical grid that have lost power due to, for example, a problematic electrical device on the electrical grid and/or the fault isolation operation that may have shut off power to these customers. The utility back end watcher may then identify available switches upstream and downstream from the problematic electrical device that allow for power restoration to part or all customers. The watcher in the utility back end 210 may determine a best combination of the upstream and downstream switches which would restore power to a maximum number of very important (VIP) customers (e.g., medical baseline emergency centers, large commercial and residential customers) or customers.

In embodiments, this determination may be done by closing each upstream, remotely-controllable switch, running power flow through the switch, calculating a number of restored customers due to the closing of the switch, and ranking the switch amongst other upstream switches based on the number of restored customers. Similarly, the utility back end watcher may close each downstream, remotely-controllable switch, run power flow through the switch, calculate a number of restored customers due to the closing of the switch, and rank the switch among other downstream switches based on the number of restored customers. Based on the rankings of the upstream and downstream switches, the best combination of upstream and downstream switches is determined and is placed into a switching plan for the electrical grid. To ensure grid stability and resiliency, the watcher in the utility back end 210 may validate the switching plan by recalculating the power flow through the determined upstream and downstream switches and the number of restored customers, and by checking responses (e.g., expected new states) of the determined switches.

Based on the validated switching plan, the utility back end watcher sends SIP-based command messages to the determined upstream and downstream switches. For example, the command messages may include a services restoration command message that instructs the switches to open or close to allow restoration of power to customers. The command message may be sent to, for example, a circuit breaker near a problematic electrical device that was previously shut off to isolate the electrical device, and the command message may instruct the circuit breaker to be turned back on to reroute power back into the electrical device. Advantageously, the service restoration operation of the present invention avoids any potential electrical loops and additional electrical faults, while restoring power to customers as soon as electrical faults are isolated.

In a predictive operation, an electrical device (e.g., the electrical device 110) located in, for example, the building 215, the grids 220, 225, and/or 230, and/or the power station 235, can send to at least one presence server (e.g., the decentralized presence server 240A and/or the centralized presence server 255A) current status information of the electrical device, via a SIP-based notification message. In embodiments, the status information may include, for example, the following:
  (i) a voltage at the electrical device;
  (ii) a reactive power at the electrical device;
  (iii) a real power at the electrical device;
  (iv) an open or closed (e.g., turned on or off) status of the electrical device; and/or
  (v) a tap position of the electrical device (e.g., a transformer).

In embodiments, the electrical device can send to a presence server critical events or abnormal electrical conditions at the electrical device, via a SIP-based notification message. These critical events may include, for example, the following:
  (i) indication that a voltage at the electrical device is greater or less than a predetermined threshold;
  (ii) indication that a frequency at the electrical device is greater or less than a predetermined threshold; and/or
  (iii) indication that a current at the electrical device is greater or less than a predetermined threshold.

In accordance with further aspects of the invention, a watcher in the utility front end 205 (e.g., the subscriber device 115) and/or the utility back end 210 (e.g., the utility manager 105) can subscribe to at least one presence server (e.g., the decentralized presence server 240A and/or the centralized presence server 255A) to watch for (e.g., receive) notification messages from electrical devices on an electrical grid. Once received, the decentralized or centralized watcher may analyze the notification messages and predict a location of a root of an electrical problem on the electrical grid. For example, the decentralized or centralized watcher may predict that a location of a root of an electrical problem is at a particular electrical device, and/or that an electrical fault may occur at such electrical device. If the watcher does predict that an abnormal condition or an electrical fault at an electrical device, the watcher may issue a SIP-based alarm message to be displayed to an operator of a Supervisory Control and Data Acquisition (SCADA) system responsible for a particular area where the electrical device is located. The watcher may also suggest a possible reconfiguration of the electrical device to isolate the abnormal condition, in which the system operator decides how to proactively react to the abnormal condition prior to a power outage or another electrical fault. In embodiments, the watcher may automatically request a fault isolation operation to isolate the predicted electrical fault. Advantageously, the present invention provides a predictive operation to identify potential problems at electrical devices and to prevent the problems before they occur, in addition to providing a reactive operation to identify and isolate electrical fault that have already occurred.

Figure 3:
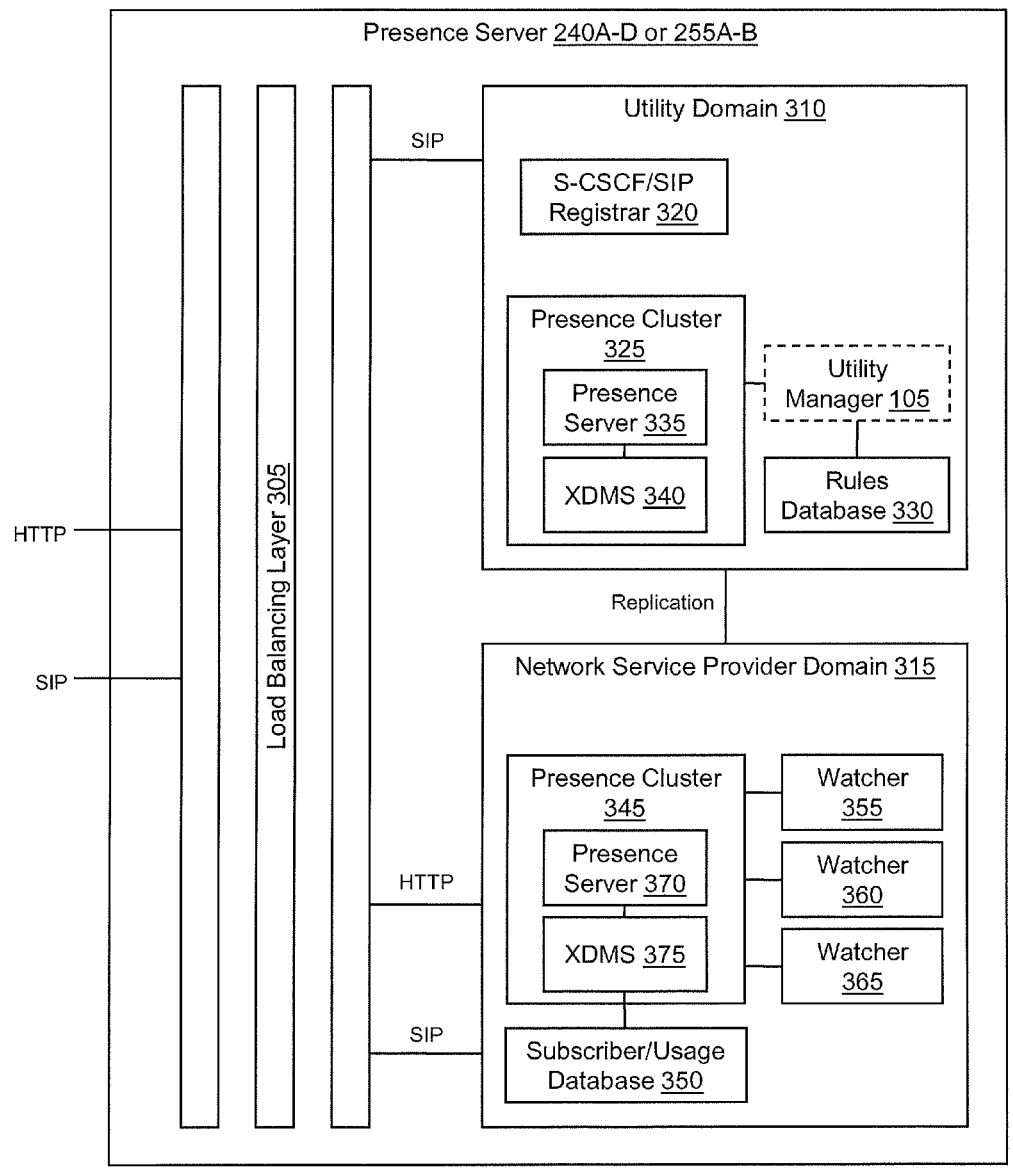
FIG. 3 shows an illustrative environment of a presence server for implementing steps in accordance with aspects of the invention.

FIG. 3 shows an illustrative environment of the presence server 240A, 240B, 240C, 240D, 255A, or 255B, for implementing steps in accordance with aspects of the invention. In embodiments, the presence server 240A, 240B, 240C, 240D, 255A, or 255B can include a load balancing layer 305, a utility domain 310, and a network service provider domain 315. Components (e.g., the electrical device 110 and the subscriber device 115 in FIGS. 1-2) communicate with the domains 310, 315 via the load balancing layer 305 which may distribute data (e.g., a load) evenly between the above entities. For example, the load balancing layer 305 may be provided in a network switch and a gateway router, which may be implemented in the computing device 14 of FIG. 1. The load balancing layer 305 includes a SIP client and a web client such that the load balancing layer 305 is able to communicate in SIP and HTTP with other SIP-enabled and/or HTTP-enabled entities.

The utility domain 310 is a network domain of an electricity supplier, a utility provider, and/or other service provider. In embodiments, the utility domain 310 can include a Serving Call Session Control Function (S-CSCF)/SIP registrar 320, a presence cluster 325, the utility manager 105, and a rules database 330. The S-CSCF/SIP registrar 320 is a SIP server that controls SIP sessions between components (e.g., the electrical device 110 and the subscriber device 115 in FIGS. 1-2) and the domains 310, 315. In particular, the S-CSCF/SIP registrar 320 handles SIP registrations of the electrical device 110 and the subscriber device 115. So, over and above a Mobile Subscriber Integrated Services Digital Network Number (MSISDN) of these entities, they are registered as IP Multimedia Subsystem (IMS)/SIP clients in the domains 310, 315. In embodiments, the S-CSCF/SIP registrar 320 may be implemented in the server 12 and/or the computing device 14 in FIG. 1, and may be alternatively located in the network service provider domain 315 and/or a third-party location. After registration, the S-CSCF/SIP registrar 320 forwards SIP messages from the electrical device 110 and the subscriber device 115 to components in the domains 310, 315, such as the presence cluster 325.

The presence cluster 325 includes a presence server 335 and an Extensible Markup Language (XML) Data Management Server (XDMS) 340. The presence server 335 is a SIP application server that communicates and stores presence information of client devices, such as the electrical device 110 and the subscriber device 115. The presence server 335 can be implemented in the server 12 of FIG. 1 and, for example, in the utility manager 105. Specifically, the presence server 335 receives SIP notify messages including the presence information from the client devices. In the case of the electrical grid, the presence information may include, for example, a location of the electrical device 110. Further, the presence information may include the status information of the electrical device 110 that indicates a voltage, current, and/or power, generated or transmitted by the electrical device 110. In embodiments, the status information of the electrical device 110 may include, for example, the following:

(i) a voltage at the electrical device 110;
(ii) a reactive power at the electrical device 110;
(iii) a real power at the electrical device 110;
(iv) an open or closed (e.g., turned on or off) status of the electrical device 110; and/or
(v) a tap position of the electrical device 110 (e.g., a transformer).

In accordance with further aspects of the invention, the presence information can include an indication that an electrical fault or abnormal condition has been detected locally by the electrical device 110. Such an indication may be determined based on SIP-based fault detection notification messages received from an electrical device 110. An indication of an abnormal condition (e.g., a critical event) may include, for example, the following:

(i) indication that a voltage at the electrical device 110 is greater or less than a predetermined threshold;
(ii) indication that a frequency at the electrical device 110 is greater or less than a predetermined threshold; and/or
(iii) indication that a current at the electrical device 110 is greater or less than a predetermined threshold.

With this received presence information, the presence server 335 sends the presence information to the XDMS 340 that builds or updates a presence document including the presence information. In embodiments, this presence document can include the presence information of all electrical devices and subscriber devices within a specified area of the electrical grid. The presence document may include multiple nodes, or in other words, the presence document may refer to multiple areas in the electrical grid and their associated client devices. In embodiments, the presence document and the SIP messages can be in a XML format, a Rich Presence Information Data (RPID) format, and/or a Presence Information Data Format (PDIF). The XDMS 340 may be implemented in the server 12 of FIG. 1.

Additionally, the presence server 335 receives SIP subscribe messages from the client devices, for example, the subscriber device 115 and the utility manager 105. The SIP subscribe messages are requests to receive (e.g., to subscribe to) updates about the presence information from the presence server 335. The presence server 335 manages these SIP subscribe messages from the client devices and when there is an update about the presence information, the presence server 335 automatically sends SIP publish messages (with the presence information) quickly and effectively to the subscribing client devices (e.g., the subscriber device 115 and the utility manager 105). The presence server 335 may send information regarding the subscribing client devices ("subscriber presence information") to the XDMS 340, which may then update the corresponding presence document to include such subscriber presence information. As a result, the presence document may include information regarding relationships between electrical devices and subscribing client devices interested in receiving updated presence information with respect to these electrical devices. That is, the presence document can associate each of its nodes to the subscriber, enabling enhanced utility data tracking with tight association to the specific subscriber or the utility provider that may be responsible for reconfiguring one or more electrical devices.

The presence information and other pertinent information can be provided to the utility manager 105 via SIP messaging. By quickly updating the utility manager 105 with the presence information of the electrical device 110 via a SIP channel, the utility manager 105 can rapidly react to any notification in a temporally and channel-appropriate manner. For example, the utility manager 105 can react to a notification "out-of-band," e.g., dispatch a field crew to the electrical device to manually configure the electrical device 110 if the notification indicates that the field crew can safely work with the electrical device 110. In another example, the field crew and/or the utility manager 105 can react to a notification "in-band," e.g., remotely send a command message (e.g., a SIP message) to the electrical device 110 to turn on or off the electrical device 110. In embodiments, the command message may include instructions for the electrical device 110 to change its configuration in various ways, such as to be re-energized or de-energized and to increase or decrease a voltage generated by the electrical device 110, for example, in order to isolate an electrical fault detected by the utility manager 105. In addition, the presence cluster 325 (specifically, the XDMS 340) may update the presence document pertaining to the electrical device 110 to include information regarding the command message sent to the electrical device 110. In embodiments, the field crew and/or the utility manager 105 may send the command message through the presence server 335 (updating the pertinent presence document) to the electrical device 110. Advantageously, the use of SIP messaging is massively scalable and results in low latency communications between the electrical device 110, the subscriber device 115, the presence server 335, and/or the utility manager 105.

The rules database 330 includes and stores rules set by the subscriber, the service provider, and/or the utility manager 105 regarding monitoring and control of the electrical device(s) 110. For example, the rules can indicate that the subscriber has allowed the utility provider (e.g., the utility manager 105) to control the electrical device 110. The rules may also indicate what constitutes critical events at the electrical device 110 that require control of the electrical device 110 and thus, include event lists and event categories. For example, these critical events can include the electrical device 110 (i) generating or transmitting power over or under a predetermined threshold, (ii) being on or off, (iii) indicating a blown fuse or a maintenance signal, (iv) overheating, (v) having an electrical fault, etc. The control of the electrical device 110 may be accomplished via the utility manager 105 (and/or another watcher) sending or forwarding a command message to the electrical device 110 that is determined from the rules database 330. The command message can include a command indicating to the electrical device 110 which actions to take in response to a critical event at the electrical device 110. For example, the command message may include a SIP-based fault isolation command message that instructs the electrical device 110 to execute requested configuration changes (e.g., switch on or off) aimed at isolating an electrical fault or abnormal condition. In another example, the rules may indicate to the utility manager 105 to dispatch a field crew to the electrical device 110 to isolate an electrical fault at the elec-trical device 110, and/or to perform or initiate other actions to take in response to critical events. In embodiments, the rules database 330 may be set by a subscriber, a service provider, etc., via the subscriber device 115.

The network service provider domain 315 is a network domain of an Internet service provider and/or a cellular service provider. In embodiments, the network service provider domain 315 can include a presence cluster 345, a subscriber/usage database 350, and watchers 355, 360, and 365. The presence cluster 345 includes a presence server 370 and a XDMS 375, which perform functions similar to those of the presence server 335 and the XDMS 340 in the utility domain 310. In fact, all information (e.g., the presence information and the subscriber presence information) received and processed in the presence server 335 and the XDMS 340 in the utility domain 310 may be transferred to, or replicated in, the presence server 370 and the XDMS 375 in the network service provider domain 315, and vice versa. In embodiments, replication in the domains 310, 315 can be accomplished via peering and dedicated bandwidth between the domains 310, 315. In embodiments, the presence servers 335, 370 may be in a hierarchal relationship, for example, where the presence server 335 is a primary, master server and the presence server 370 is a secondary, slave server.

The subscriber/usage database 350 receives the built or replicated presence documents from the XDMS 375 and stores the presence documents for the system. The watchers 355, 360, 365 are entities in the network service provider domain 315 that send SIP subscribe messages to the presence cluster 345 to subscribe to updates regarding the presence information in the presence server 370, e.g., the SIP publish messages. For example, one of the watchers 355, 360, 365 can represent the utility provider (e.g., a dispatcher at a utility control center), and may be implemented in the computing device 14 in FIG. 1.

By subscribing to the SIP publish messages, the watchers 355, 360, 365 are able to watch for notifications of the critical events and the status information of the electrical device 110. In addition, the watchers 355, 360, 365 are able to react to these notifications as necessary. For example, if the watcher 355 represents the utility provider and observes a notification of an electrical fault at the electrical device 110, the watcher 355 may cut electricity to the electrical device 110 (possibly via the command message to the electrical device 110), to prevent further electrical faults at other electrical devices.

In embodiments, presence infrastructure (e.g., the presence cluster 345) can be only present in the network service provider domain 315, and a watcher (e.g., the utility manager 105) can be present in the utility domain 310. In other words, the utility manager 105 may correspond to a watcher. In this embodiment, the utility manager 105 can subscribe to all presence information updates or events and react as necessary. To transfer information, the domains 310, 315 may include dedicated bandwidth between the two sides. In embodiments, the presence infrastructure can include multiple presence clusters for different types of devices, such as subscriber devices, electrical devices, and watchers.

In embodiments, a third-party watcher can be hosted in a third-party environment, which is completely configurable by a subscriber. Specifically, the subscriber may configure how the environment infrastructure could react to notifications of the critical events or the status information of the electrical device 110 or the subscriber device 115, as necessary. The infrastructure may be implemented in the server 12 and/or the computing device 14 in FIG. 1.

Figure 4:
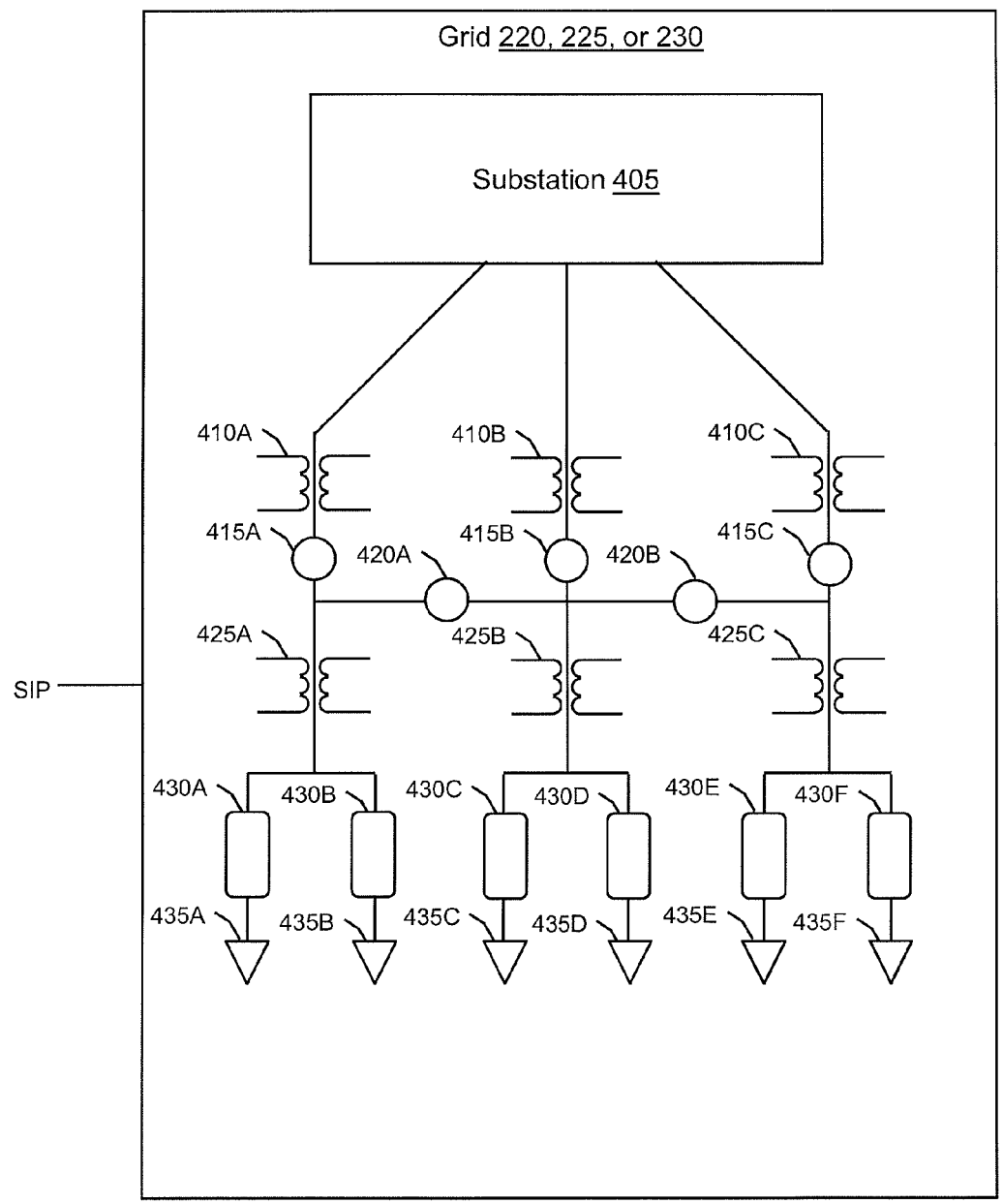
FIG. 4 shows an illustrative environment of an electrical grid for implementing steps in accordance with aspects of the invention.

FIG. 4 shows an illustrative environment of the electrical grid 220, 225, or 230 for implementing steps in accordance with aspects of the invention. In embodiments, the grid 220, 225, or 230 can include the grid 220, 225, or 230 in FIG. 2. The grid 220, 225, or 230 may include a power substation 405 operable to generate and distribute power to electrical devices in the grid 220, 225, or 230. These electrical devices may include, for example, transformers 410A, 410B, and 410C, which are electrically coupled to the substation 405. Circuits 415A, 415B, and 415C are electrically coupled to the transformers 410A, 410B, 410C, respectively, and are operable to transfer power when opened and to stop power when closed.

In embodiments, the grid 220, 225 or 230 can further include switches 420A and 420B electrically coupled to the circuits 415A, 415B, 415C, and are operable to reroute power when opened and to stop power when closed. Transformers 425A, 425B, and 425C are electrically coupled to the circuits 415A, 415B, 415C, respectively. Fuses 430A, 430B, 430C, 430D, 430E, and 430F are electrically coupled to the transformers 425A, 425B, 425C, and are operable to interrupt (or blow due to) excessive current from the transformers 425A, 425B, 425C, to prevent damage to downstream electrical devices in the grid 220, 225, or 230. These downstream electrical devices may include feeders 435A, 435B, 435C, 435D, 435E, and 435F operable to transfer power from the substation 405 to various electrical devices in and/or outside the grid 220, 225, or 230.

In accordance with further aspects of the invention, each of the substation 405 and the electrical devices in the grid 220, 225, or 230 can communicate with entities in and/or outside the grid 220, 225, or 230 (e.g., the presence servers 240A, 240B, 240C, 240D, 255A, and/or 255B) via SIP messaging. For example, each of the substation 405 and the electrical devices may send a SIP-based notification message to at least one presence server. In embodiments, the notification message may indicate a low voltage or a voltage less than a predetermined threshold, detected at one of the substation 405 and the electrical devices. For example, each of the feeders 435C, 435D, 435E, 435F, the fuses 430C, 430D, 430E, 435F, the transformers 425B, 425C, the circuit 415B, and the switch 420B may send to the presence server a notification message indicating a low voltage detected. A decentralized and/or centralized watcher (e.g., the utility manager 105 in FIGS. 2-3) connected to the presence server may receive and analyze the notification message, and determine that the transformer 410B might not be performing as expected, e.g., is predicted in an abnormal condition. The watcher may then send a SIP-based alarm message to be displayed to an operator of a Supervisory Control and Data Acquisition (SCADA) system responsible for a particular area where the transformer 410B is located. In the alarm message, the watcher may also suggest a possible reconfiguration of the transformer 410 (and/or the nearby electrical devices) to isolate the abnormal condition, in which the system operator decides how to react to the abnormal condition. Alternatively, the watcher may send a request message which requests a fault isolation operation to isolate the predicted electrical fault at the transformer 410B.

FIGS. 5-11 show exemplary flows for performing aspects of the present invention. The steps of FIG. 5-11 may be implemented in the environments of FIGS. 1-4, for example. The flowcharts and block diagrams in the Figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIGS. 1-4. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

Figure 5:
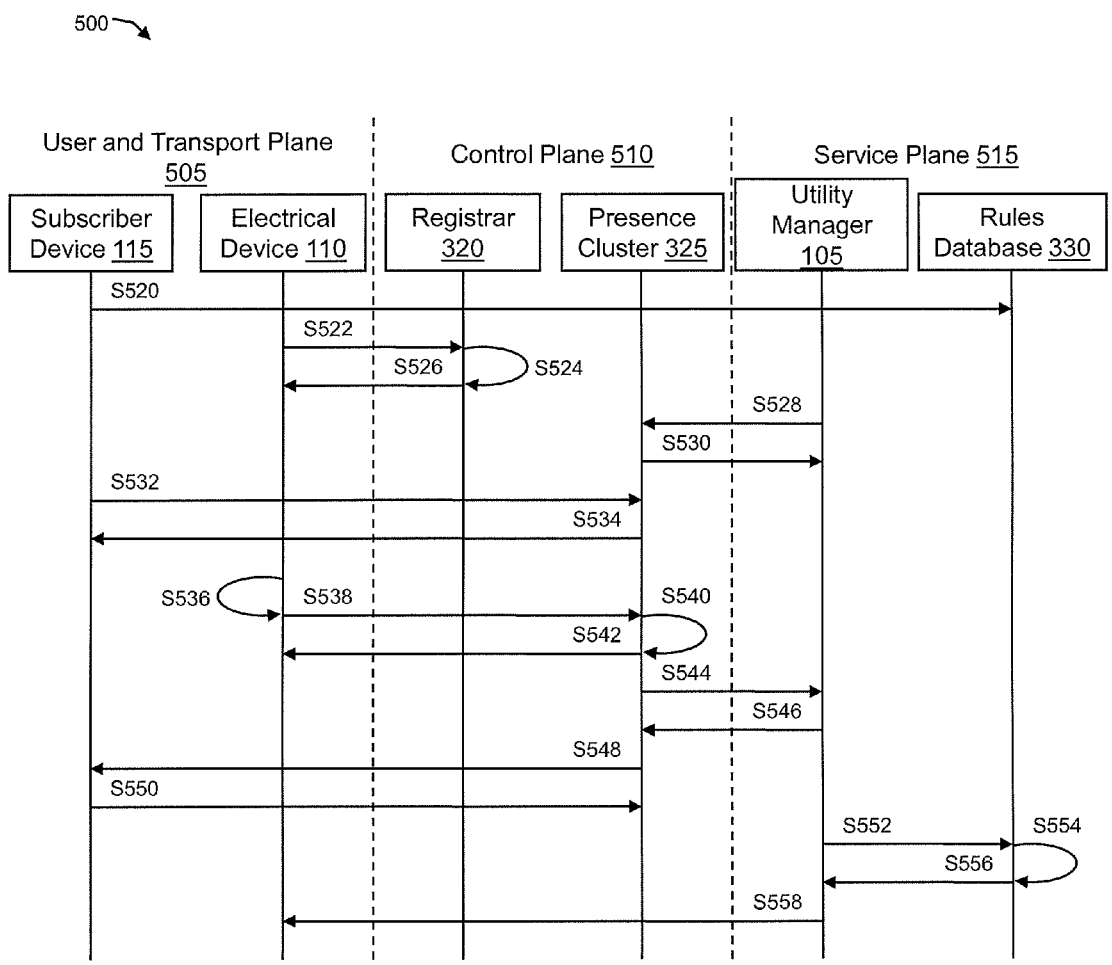
FIG. 5 shows an exemplary flow for decentralized and centralized fault isolation and service restoration in an electrical grid in accordance with aspects of the invention.

FIG. 5 depicts an exemplary flow for a process 500 of decentralized and centralized fault isolation and service restoration in an electrical grid in accordance with aspects of the present invention. The process 500 involves three players: a user and transport plane 505, a control plane 510, and a service plane 515. The user and transport plane 505 includes the subscriber device 115 and the electrical device 110, e.g. the subscriber device 115 and the electrical device 110 in FIGS. 1-2. The control plane 510 includes the registrar 320 and the presence cluster 325, e.g., the S-CSCF/SIP registrar 320 and the presence cluster 325 and/or 345 in FIG. 3. The service plane 515 includes the utility manager 105 and the rules database 330, e.g., one of the watchers 355, 360, 365 and/or the utility manager 105, and the rules database 330 in FIG. 3.

At step S520, the process starts, and the subscriber device 115 provisions a set of rules associated with specific event categories and event lists regarding the electrical device 110. These categories and lists are stored in the rules database 330. The event categories and lists may include actions to take, as and when the events (e.g., electrical faults) occur. At step S522, the electrical device 110 sends a SIP register message via a gateway router (e.g., the load balancing layer 305) to the registrar 320, to register the electrical device 110 and/or the gateway router in the IMS/SIP network.

At step S524, the registrar 320 registers the electrical device 110 and/or the gateway router in the IMS/SIP network using SIP semantics, such as Initial Filter Criteria (iFC). At step S526, the registrar 320 sends a SIP acknowledgment message to the electrical device 110 that indicates that the electrical device 110 has been registered successfully. At step S528, the utility manager 105 sends a SIP subscribe to the presence cluster 325 to subscribe to updates in presence information in the presence cluster 325, such as notifications of critical events or status information at the electrical device 110. At step S530, the presence cluster 325 sends a SIP acknowledgment message to the utility manager 105 that indicates that the utility manager 105 has subscribed successfully with the presence cluster 325.

At step S532, the subscriber device 115 sends a SIP subscribe to the presence cluster 325 to subscribe to updates in presence information in the presence cluster 325, such as notifications of critical events or status information at the electrical device 110. At step S534, the presence cluster 325 sends a SIP acknowledgment message to the subscriber device 115 that indicates that the subscriber device 115 has subscribed successfully with the presence cluster 325. At step S536, the electrical device 110 records or observes a critical event or status information (e.g., an electrical fault) at the electrical device 110. At step S538, the electrical device 110 sends a SIP notify message including presence information of the critical event or status information at the electrical device 110 to the presence cluster 325.

At step S540, the presence cluster 325 processes the SIP notify message, including building or updating a presence document including the presence information and storing the presence document in a database, e.g., the subscriber/usage database 350 in FIG. 3. At step S542, the presence cluster 325 sends a SIP acknowledgement message to the electrical device 110 that indicates that the presence information has been received and processed. At step S544, the presence cluster 325 cycles through its watcher list and sends a SIP publish message or notification (e.g., a fault detection notification message) to the utility manager 105 that includes the updated presence information. At step S546, the utility manager 105 sends a SIP acknowledgement message to the presence cluster 325 that indicates that the presence information has been received.

At step S548, the presence cluster 325 cycles through its watcher list and sends a SIP publish message or notification (e.g., a fault detection notification message) to the subscriber device 115 that includes the updated presence information. At step S550, the subscriber device 115 sends a SIP acknowledgement message to the presence cluster 325 that indicates that the presence information has been received. At step S552, the utility manger 105 requests a rule from the rules database 330 based on the notification of the critical event or status information at the electrical device 110. At step S554, the rules database 330 processes the request, specifically, determining actions to take based on the critical event or status information. At step S556, the rules database 330 responds with the rule indicating the actions to take in response to the critical event or status information. At step S558, the utility manager 105 may send a SIP-based command message (e.g., a fault isolation command message or a services restoration command message) to the electrical device 110 based on the rule indicating the actions to take. Alternatively or additionally, the utility manager may perform (initiate) actions necessary to make changes in the electrical device 110, such as dispatch a field crew to the electrical device 110. At step S558, the process ends.

Figure 6:
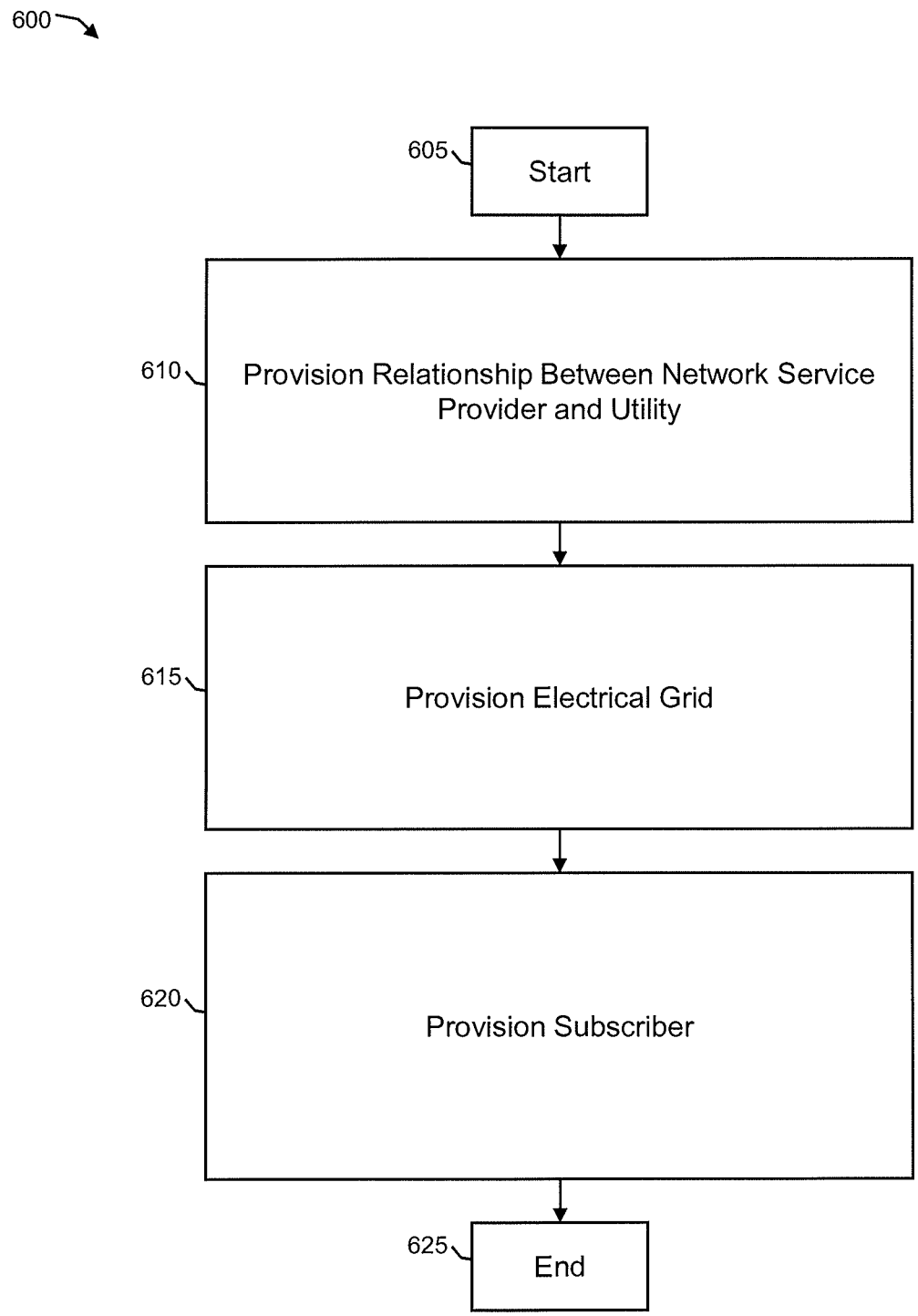
FIGS. 6-9 show exemplary flows for provisioning a system for decentralized and centralized fault isolation and service restoration in an electrical grid in accordance with aspects of the invention.

FIG. 6 shows an exemplary flow for a process 600 of provisioning a system for decentralized and centralized fault isolation and service restoration in an electrical grid in accordance with aspects of the invention. At step 605, the process starts. At step 610, a relationship and connection between a network service provider (e.g., a cellular network service) and a utility provider ("utility") is provisioned. At step 615, an electrical grid of the utility is provisioned. At step 620, a subscriber is provisioned to use the electrical grid and the network of the invention. At step 625, the process ends.

Figure 7:
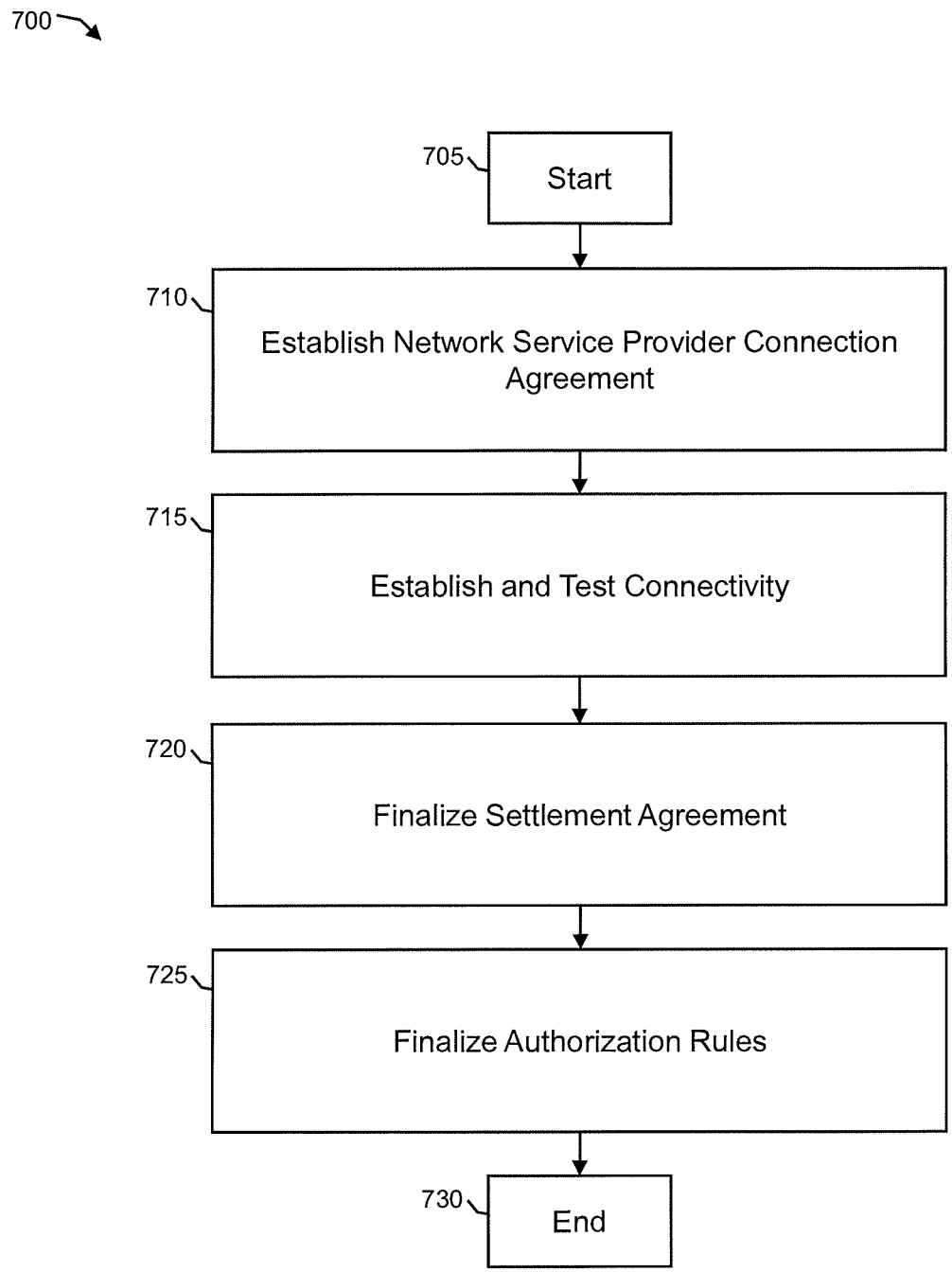

More specifically, FIG. 7 shows an exemplary flow for a process 700 of provisioning the relationship between the network service provider and the utility provider in accordance with aspects of the invention. At step 705, the process starts. At step 710, a carrier connection agreement between the network service provider and the utility is established, e.g., finalized and agreed upon. At step 715, the network service provider and the utility provider establish and test their network domain connectivity, such as peering between presence clusters in their respective domains. At step 720, a settlement (business) agreement between the network service provider and the utility is established, e.g., finalized and agreed upon. At step 725, the providers finalize authorization rules of their network domains, or rules on how to connect to their respective network domains, e.g., telecommunication rules and/or SIP registration semantics. At step 730, the process ends.

Figure 8:
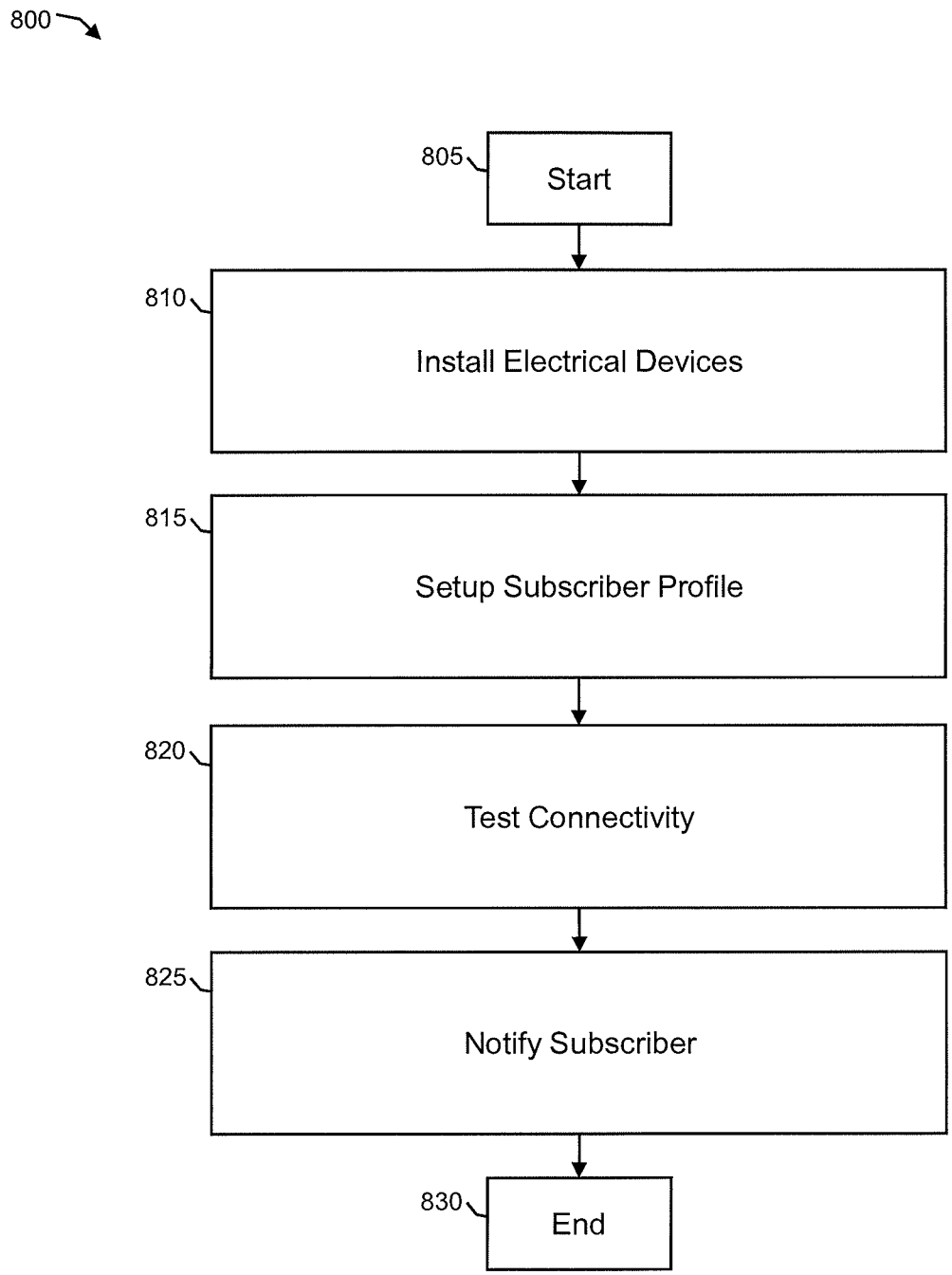

FIG. 8 shows an exemplary flow for a process 800 of provisioning the electrical grid of the utility in accordance with aspects of the invention. At step 805, the process starts. At step 810, at least one electrical device is installed in the electrical grid and connected to network domains of the utility and the network service provider. At step 815, a subscriber (e.g., a field crew) profile is setup in the network domains and in a rules database. At step 820, the utility then tests the connectivity of the electrical device with the electrical grid and the network domains. At step 825, the utility then notifies the subscriber of the connection of the electrical device to the electrical grid. At step 830, the process ends.

Figure 9:
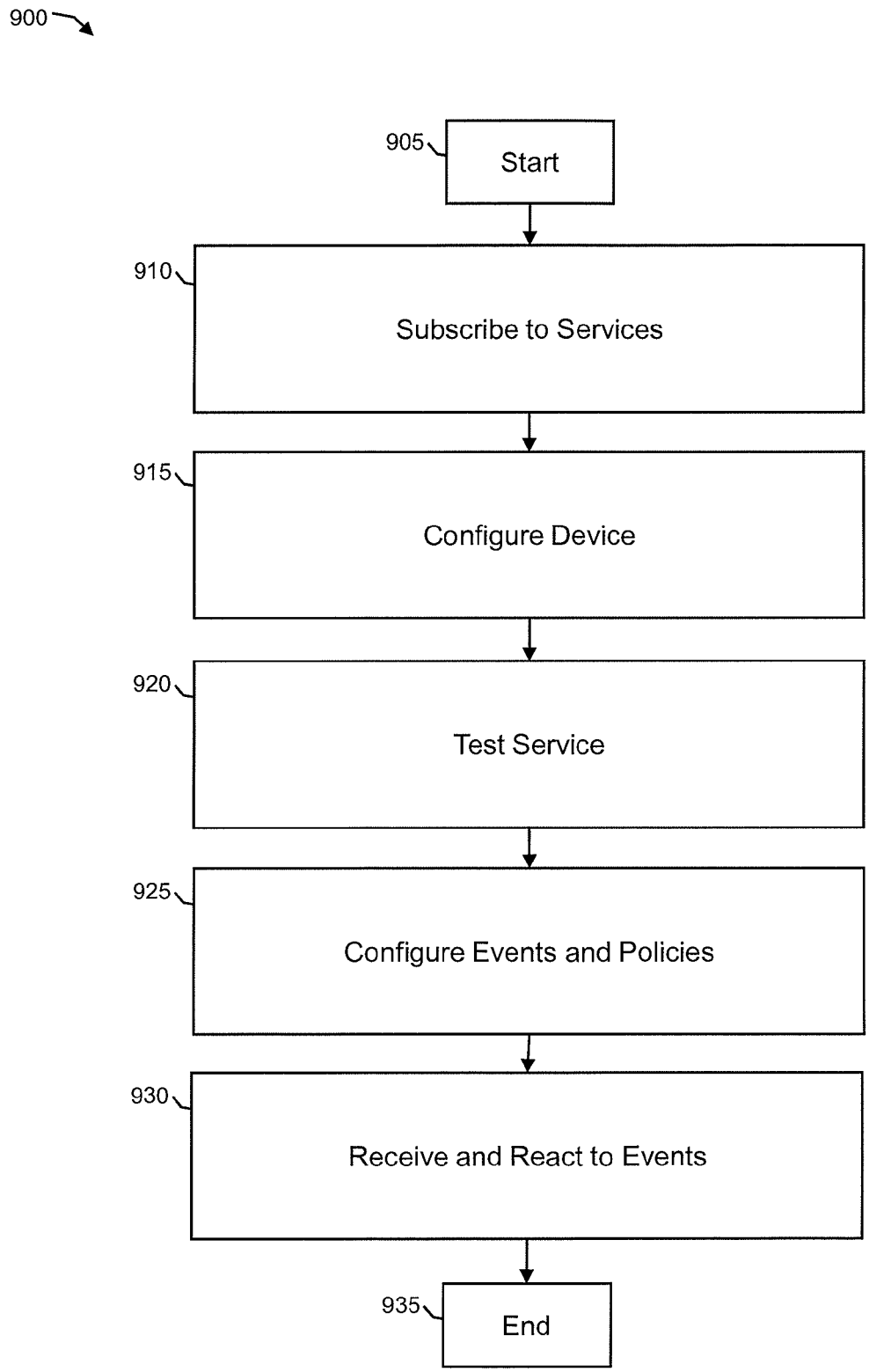

FIG. 9 shows an exemplary flow for a process 900 of provisioning the subscriber to use the electrical grid and the network in accordance with aspects of the invention. At step 905, the process starts. At step 910, the subscriber subscribes to a device information (e.g., status information of the electrical device) and SIP message service operated by the utility and/or network service provider. In embodiments, the subscriber may include, for example, the utility manager 105 and the subscriber device in 115 in FIGS. 1-2, the watchers 355, 360, 365 in FIG. 3, etc. At step 915, the subscriber then configures his or her network device (e.g., a mobile device) for use in the special service. At step 920, the subscriber may test the configured network device using the service. At step 925, through the network device, the subscriber configures critical electrical events at the electrical device and other energy control rules, by communicating with a rules database in the network domain of the utility. At step 930, the subscriber may also communicate with the presence clusters at the network domains of the utility and/or the network service provider to receive and possibly react to notifications of the critical events at the electrical device. At step 935, the process ends.

Figure 10:
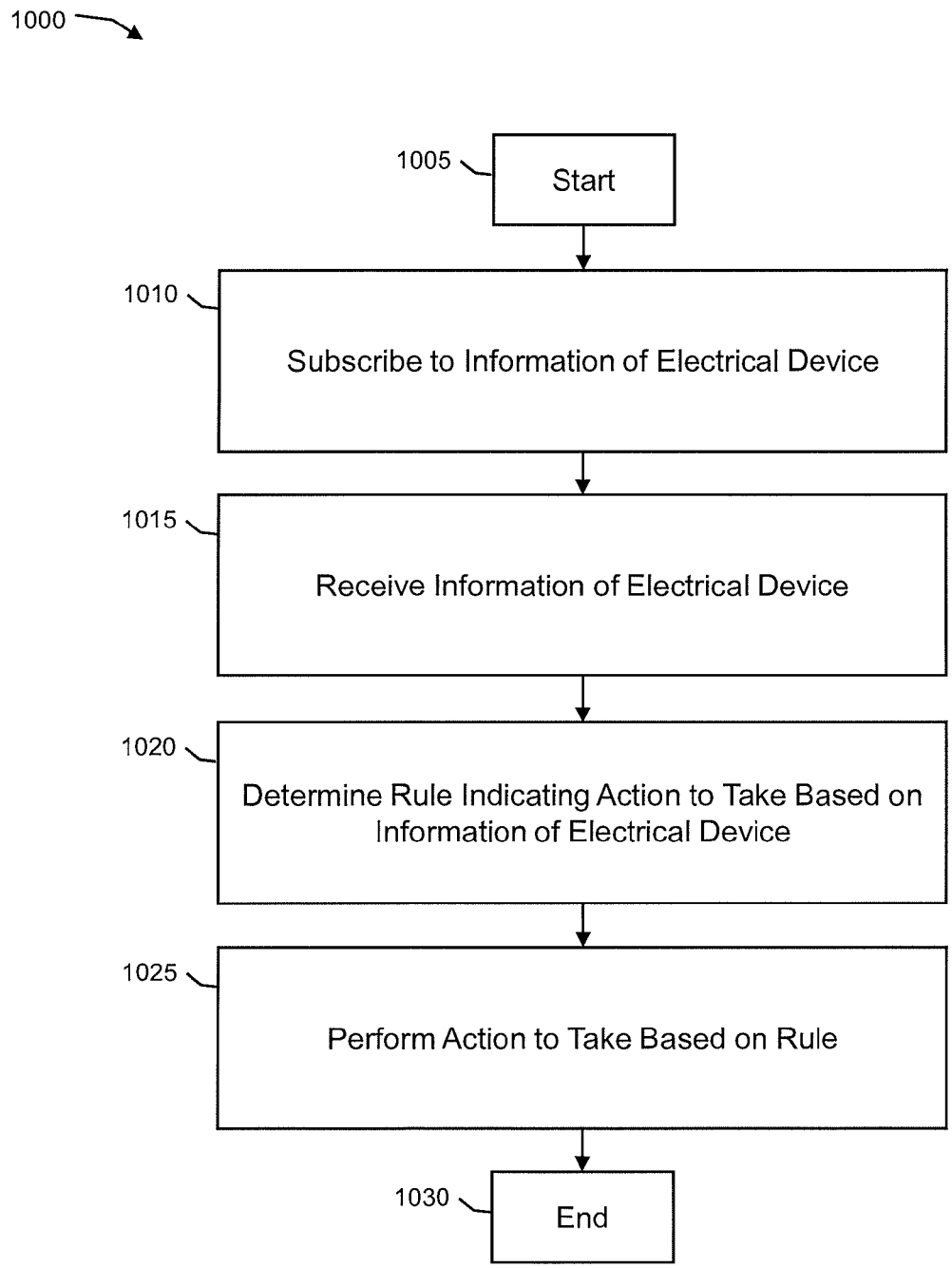
FIGS. 10-12 show additional exemplary flows for decentralized and centralized fault isolation and service restoration in an electrical grid in accordance with aspects of the invention.

FIG. 10 depicts another exemplary flow for a process 1000 of decentralized and centralized fault isolation and service restoration in an electrical grid in accordance with aspects of the present invention. In embodiments, the process 1000 may be performed by the utility manager 105 in FIGS. 1-3. At step 1005, the process starts. At step 1010, the utility manager subscribes to notifications of critical events or status information at an electrical device (e.g., the electrical device in FIGS. 1-2), such as through sending a SIP subscribe message to a presence cluster. At step 1015, the utility manager receives the notifications of the critical events or status information (e.g., an electrical fault) at the electric device, such as via receiving a SIP publish message. At step 1020, the utility manager determines a rule from a rules database (e.g., the rules database 330 in FIG. 3) based on the notification of the critical event or status information at the electrical device. At step 1025, the utility manager either sends a command message to the electrical device based on the rule indicating the actions to take, or performs (initiates) actions necessary to make changes in the electrical device, such as dispatch a field crew to the device. For example, the command message may instruct the electrical device (or nearby electrical devices) to shut off or decrease output power to isolate an electrical fault detected at the electrical device. At step 1030, the process ends.

Figure 11:
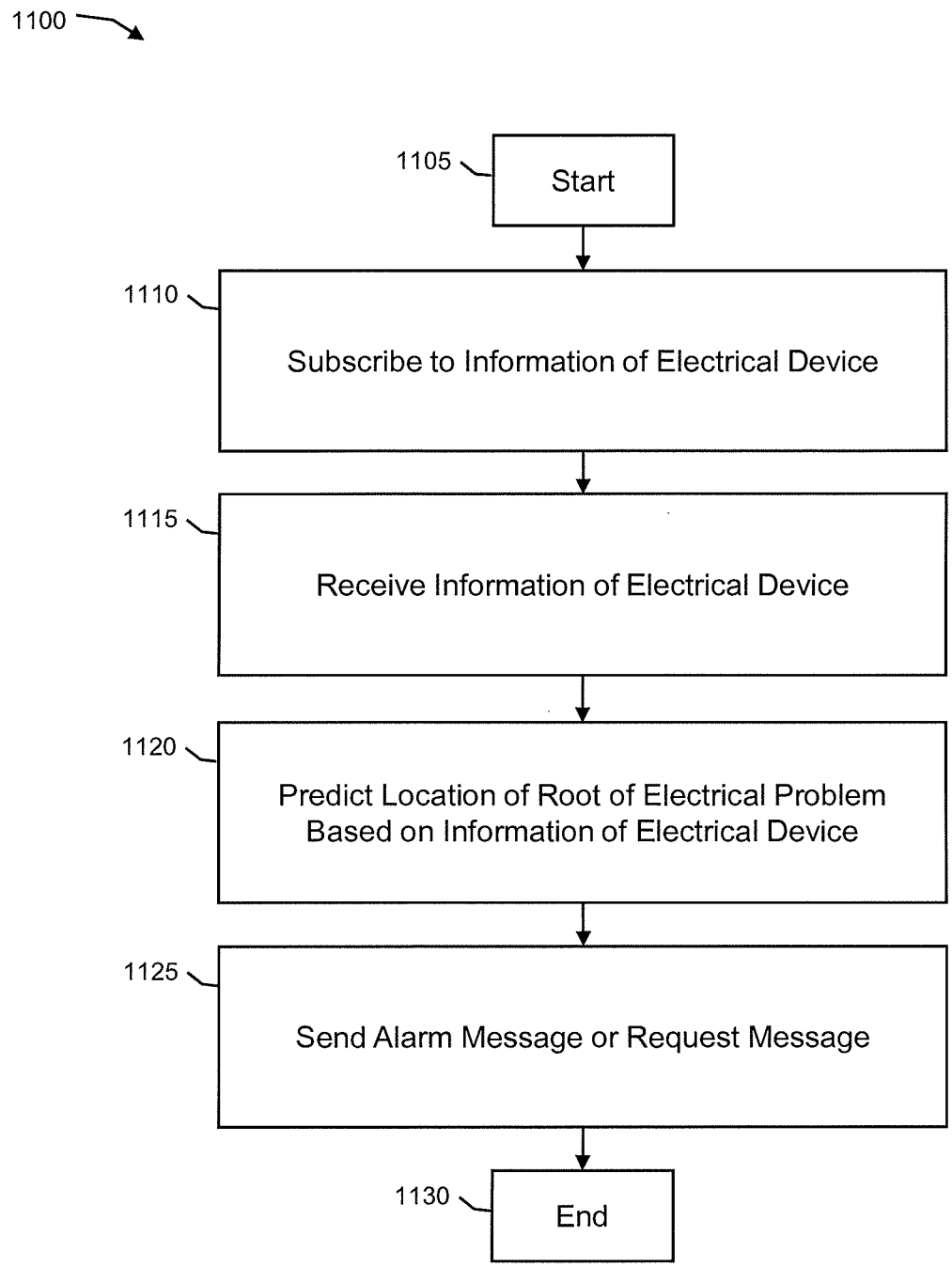

FIG. 11 depicts another exemplary flow for a process 1100 of decentralized and centralized fault isolation and service restoration in an electrical grid in accordance with aspects of the present invention. In embodiments, the process 1100 may be performed by the utility manager 105 in FIGS. 1-3. At step 1105, the process starts. At step 1110, the utility manager subscribes to notifications of critical events or status information at an electrical device (e.g., the electrical device in FIGS. 1-2), such as through sending a SIP subscribe message to a presence cluster. At step 1115, the utility manager receives the notifications of the critical events or status information (e.g., an electrical fault) at the electric device, such as via receiving a SIP publish message. At step 1120, the utility manager predicts a location of a root of an electrical problem on the electrical grid based on the notifications of the critical events or status information at the electrical device. For example, the utility manager may predict that a location of a root of an electrical problem is at the electrical device, and/or that an electrical fault may occur at such electrical device. At step 1125, the utility manager may send a SIP-based alarm message to be displayed to an operator of a Supervisory Control and Data Acquisition (SCADA) system responsible for a particular area where the electrical device is located. In the alarm message, the utility manager may also suggest a possible reconfiguration of the electrical device to isolate the electrical problem, in which the system operator decides how to react to the electrical condition. Alternatively, the utility manager may send a request message which requests a fault isolation operation to isolate the predicted electrical fault at the electrical device. At step 1130, the process ends.

Figure 12:
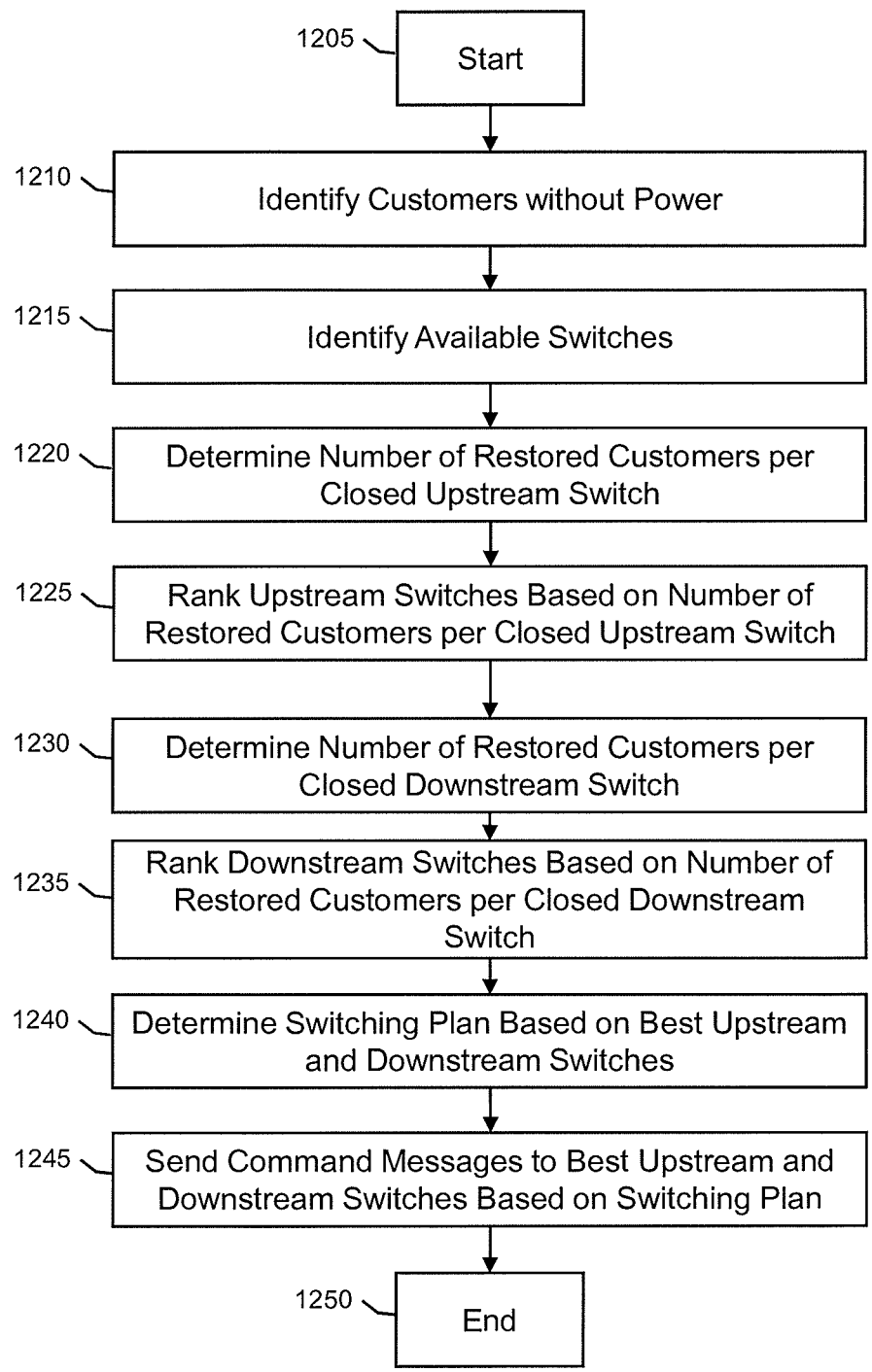

FIG. 12 depicts another exemplary flow for a process 1200 of decentralized and centralized fault isolation and service restoration in an electrical grid in accordance with aspects of the present invention. In embodiments, the process 1200 may be performed by the utility manager 105 in FIGS. 1-3. At step 1205, the process starts. At step 1210, the utility manager identifies customers on an electrical grid without power due to, for example, a problematic electrical device on the electrical grid and/or the fault isolation operation shutting off power to these customers. At step 1215, the utility manager identifies available switches upstream and downstream from the problematic electrical device that allow for power restoration to part or all customers.

At step 1220, the utility manager determines a number of restored customers per closed upstream switch. In embodiments, this determination may be done by closing each upstream, remotely-controllable switch, running power flow through the switch, and calculating a number of restored customers due to the closing of the switch. At step 1225, the utility manager ranks upstream switches based on the number of restored customers per closed upstream switch. For example, a first closed upstream switch that restores power to five customers would be ranked higher than a second closed upstream switch that restores power to two customers. At step 1230, the utility manager determines a number of restored customers per closed downstream switch. In embodiments, this determination may be done by closing each downstream, remotely-controllable switch, running power flow through the switch, and calculating a number of restored customers due to the closing of the switch. At step 1235, the utility manager ranks the downstream switches based on the number of restored customers per closed downstream switch. For example, a first closed downstream switch that restores power to four customers would be ranked higher than a second closed downstream switch that restores power to two customers.

At step 1240, based on the rankings of the upstream and downstream switches, the utility manager determines the best combination of upstream and downstream switches and determines a switching plan for the electrical grid based on the best upstream and downstream switches. At step 1245, the utility manager sends SIP-based command messages to the determined upstream and downstream switches based on the switching plan. For example, the command messages may include services restoration command messages that instructs the switches to open or close to allow restoration of power to customers. At step 1250, the process ends.

In embodiments, a service provider, such as a Solution Integrator, could offer to perform the processes described herein. In this case, the service provider can create, maintain, deploy, support, etc., the computer infrastructure that performs the process steps of the invention for one or more customers. These customers may be, for example, any business that uses technology and provides or utilizes services. In return, the service provider can receive payment from the customer(s) under a subscription and/or fee agreement and/or the service provider can receive payment from the sale of advertising content to one or more third parties.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments described herein are intended to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method, comprising:
 receiving a notification message comprising a state of an electrical component on an electrical grid;
 determining, by a computing system, a command message comprising at least one action to take in response to the state of the electrical component; and sending the command message to at least one of the electrical component and other electrical components on the electrical grid,
    wherein the sending comprises restoring power to at least one customer by sending the command message to at least one switch that instructs the at least one switch to one of open and close.

2. The method of claim 1, wherein the electrical component and the other electrical components are reconfigured based on the command message by performing the at least one action to take in response to the state of the electrical component.

3. The method of claim 1, wherein the state of the electrical component comprises at least one of:
    an indication that an electrical fault has been detected at the electrical component;
    a voltage at the electrical component;
    a reactive power at the electrical component;
    a real power at the electrical component;
    an open or closed status of the electrical component;
    a tap position of the electrical component;
    an indication that a voltage at the electrical component is greater or less than a predetermined threshold;
    an indication that a frequency at the electrical component is greater or less than a predetermined threshold; and
    an indication that a current at the electrical component is greater or less than a predetermined threshold.

4. The method of claim 1, wherein the command message comprises a SIP-based fault isolation command message which instructs at least one of the electrical component and the other electrical components to execute configuration changes aimed at isolating an electrical fault or abnormal condition at the electrical component and rerouting electricity around the electrical component.

5. The method of claim 4, wherein the command message comprises a SIP-based services restoration command message which instructs at least one of the electrical component and the other electrical components to one of open and close to allow restoration of power to areas on the electrical grid.

6. The method of claim 1, wherein the receiving, the sending, and the determining are performed at a back end, centralized premise of a utility, the back end, centralized premise comprising at least one of a utility control center, a distribution, transmission, and generation control center, and an Independent System Operator (ISO)/Regional Transmission Organization (RTO) grid control center.

7. The method of claim 1, wherein the receiving, the sending, and the determining are performed at a front end, decentralized premise of a utility, the front end, decentralized premise comprising at least one of a building, a complex of buildings, a low-voltage grid, a high-voltage grid, an extra high-voltage grid, and a power station.

8. The method of claim 1, wherein the receiving, the sending, and the determining are performed at a back end, centralized premise of a utility and at a front end, decentralized premise of the utility, the back end, centralized premise comprising at least one of a utility control center, a distribution, transmission, and generation control center, and an Independent System Operator (ISO)/Regional Transmission Organization (RTO) grid control center, and the front end, decentralized premise comprising at least one of a building, a complex of buildings, a low-voltage grid, a high-voltage grid, an extra high-voltage grid, and a power station.

9. The method of claim 1, further comprising:
    identifying the at least one customer on the electrical grid without power;
    identifying at least one available switch on the electrical grid; and
    determining the at least one switch for restoring power to the at least one customer based on the at least one customer and the at least one available switch.

10. The method of claim 1, wherein a service provider at least one of creates, maintains, deploys and supports a computer infrastructure operable to perform the steps of claim 1.

11. The method of claim 1, wherein the steps of claim 1 are provided by a service provider on a subscription, advertising, and/or fee basis.

12. A computer program product comprising a computer usable storage device having readable program code embodied in the storage device, the computer program product comprises at least one component operable to:
    receive a notification message comprising a state of an electrical component on an electrical grid;
    determine a command message comprising at least one action to take in response to the state of the electrical component; and
    send the command message to at least one of the electrical component and other electrical components on the electrical grid,
    wherein the sending the command message comprises restoring power to at least one customer by sending the command message to at least one switch that instructs the at least one switch to one of open and close.

13. The computer program product of claim 12, wherein the electrical component and the other electrical components are reconfigured based on the command message by performing the at least one action to take in response to the state of the electrical component.

14. A computer system for decentralized and centralized fault isolation and service restoration in an electrical grid, the system comprising:
    a CPU, a computer readable memory and a computer readable storage media;
    first program instructions to receive a notification message comprising a state of an electrical component on the electrical grid;
    second program instructions to determine a command message comprising at least one action to take in response to the state of the electrical component; and
    third program instructions to send the command message to at least one of the electrical component and other electrical components on the electrical grid to reconfigure the electrical grid to bypass the fault isolation,
    wherein the sending the command message comprises restoring power to at least one customer by sending the command message to at least one switch that instructs the at least one switch to one of open and close,
    wherein the electrical component and the other electrical components are reconfigured based on the command message by performing the at least one action to take in response to the state of the electrical component, and
    wherein the first, second, and third program instructions are stored on the computer readable storage media for execution by the CPU via the computer readable memory.

* * * * *